United States Patent [19]
Nicollian et al.

[11] Patent Number: 5,612,628
[45] Date of Patent: Mar. 18, 1997

[54] METHOD AND APPARATUS FOR MEASURING THE BARRIER HEIGHT DISTRIBUTION IN AN INSULATED GATE FIELD EFFECT TRANSISTOR

[75] Inventors: Edward H. Nicollian, Mecklenburg County, N.C.; Davorin Babic, Chicago, Ill.; John C. Lofgren, Mecklenburg County, N.C.

[73] Assignee: University of North Carolina, Charlotte, N.C.

[21] Appl. No.: 586,961

[22] Filed: Jan. 16, 1996

Related U.S. Application Data

[62] Division of Ser. No. 319,872, Oct. 7, 1994, Pat. No. 5,493,231.

[51] Int. Cl.$^6$ .................................................. G01R 31/26
[52] U.S. Cl. ........................................ 324/769; 324/766
[58] Field of Search .......................... 324/537, 765–769, 324/752; 257/48; 29/593; 437/8

[56] References Cited

U.S. PATENT DOCUMENTS

| | | | |
|---|---|---|---|
| 3,605,015 | 9/1971 | Copeland, III | 324/766 |
| 4,382,229 | 5/1983 | Cottrell et al. | 324/765 |
| 4,544,887 | 10/1985 | Kamieniecki | 324/752 |
| 5,168,159 | 12/1992 | Yagi | 250/306 |
| 5,200,693 | 4/1993 | Singletery, Jr. | 324/767 |

OTHER PUBLICATIONS

Richard Williams, *Photoemission of Electrons from Silicon into Silicon Dioxide*, Physics Review, vol. 140, No. 2A, Oct. 18, 1965, pp. A569–575.

Alvin M. Goodman, *Photoemission of Electrons from Silicon and Gold into Silicon Dioxide*, Physical Review, vol. 144, No. 2, Apr. 15, 1966, pp. 588–593.

C. A. Mead, E. H. Snow and B. E. Deal, *Barrier Lowering and Field Penetration at Metal–Dielectric Interfaces*, Applied Physics Letters, vol. 9, No. 1, Jul. 1, 1966, pp. 53–55.

W. Ludwig and B. Korneffel, *Photoemission Studies on Thin Metal–Insulator–Metal Sandwiches*, Phys. Stat. Sol., vol. 24, (1967), pp. K137–40 (month unavailable).

R. J. Powell, *Interface Barrier Energy Determination from Voltage Dependence of Photoinjected Currents*, Journal of Applied Physics, vol. 41, No. 6, May 1970, pp. 2424–2432.

T. H. Ning, C. M. Osburn, and H. N. Yu, *Emission Probability of Hot Electrons from Silicon into Silicon Dioxide*, Journal of Applied Physics, vol. 48, No. 1, Jan. 1977, pp. 286–293.

H. Kroemer, Wu–Yi Chien, J. S. Harris, Jr. and D. D. Edwall, *Measurement of Isotype Heterojunction Barriers by C–V Profiling* a). Appl. Phys. Lett., vol. 36, No. 4, Feb. 15, 1980, pp. 295–297.

J. R. Brews and E. H. Nicollian, *Improved MOS Capacitor Measurements Using the Q–C Method*, Solid–State Electronics, vol. 27, No. 11, 1984, pp. 963–975 (month unavailable).

Primary Examiner—Ernest F. Karlsen
Assistant Examiner—Russell M. Kobert
Attorney, Agent, or Firm—Bell, Seltzer, Park & Gibson, P.A.

[57] ABSTRACT

A method and apparatus for measuring the barrier height distribution in an insulated gate field effect transistor by intermittently illuminating a partially transparent gate electrode under bias while applying varying back gate biases to the hack gate electrode and measuring the currents conducted by the gate electrode and by the connected source and drain electrodes. Based upon the inverse Laplace transform of the ratio of the measured currents, the barrier height distribution in the transistor, including the average barrier height and the variance of the distribution of barrier heights, typically a Gaussian distribution, may be determined. A method and apparatus for adjusting the gate bias to compensate for variations in the electric field in the insulator layer due to charge generation in the insulator layer is also provided. In addition, the method and apparatus also provides for measuring the photocurrent collected under the gate electrode.

11 Claims, 5 Drawing Sheets

METHOD AND APPARATUS FOR MEASURING THE BARRIER HEIGHT DISTRIBUTION IN AN INSULATED GATE FIELD EFFECT TRANSISTOR

This application is a divisional of application Ser. No. 08/319,872, filed Oct. 7, 1994, now U.S. Pat. No. 5,493,231.

FIELD OF THE INVENTION

The present invention relates generally to electrical measuring systems and, more particularly, to semiconductor device measuring systems and methods.

BACKGROUND OF THE INVENTION

Insulated gate field effect transistors (IGFET), such as metal insulator semiconductor field effect transistors (MISFET) and, more specifically, metal oxide semiconductor field effect transistors (MOSFET) are utilized in a wide variety of applications. These applications include use in measuring devices and digital and analog applications in integrated circuit technology.

An IGFET includes a semiconductor substrate, such as a monocrystalline silicon (Si) substrate which is typically doped with either an n-type dopant, such as phosphorous, or a p-type dopant, such as boron. An IGFET also includes an insulating layer, typically formed by an oxide such as silicon dioxide ($SiO_2$), which is grown or deposited on one surface of the semiconductor substrate. In turn, conductive material, such as degeneratively doped polycrystalline (polysilicon) and/or metal, is deposited on the surface of the insulating layer, opposite the semiconductor substrate.

An IGFET also includes laterally spaced source and drain regions formed in the semiconductor substrate on opposite sides of the insulating layer. The source and drain regions are also typically doped with a dopant having the opposite type from that with which the substrate is doped. For example, n-doped source and drain regions are formed within a p-doped substrate of an IGFET.

Electrical contacts are then formed to the metal or degeneratively doped polysilicon layer and to the surface of the semiconductor substrate opposite the insulating layer. The electrode to the metal or degeneratively doped polysilicon layer is generally referred to as the gate electrode and the electrode to the semiconductor layer is generally referred to as the back gate electrode. Source and drain contacts or electrodes are formed to the laterally spaced source and drain regions of the IGFET.

The performance of a semiconductor device, such as an IGFET, is defined, in part, by the energy barrier or barrier height of the interface between the different materials forming the semiconductor device. For example, the performance of an IGFET depends upon the barrier height between the valence band of the semiconductor substrate and the conduction band of the overlying insulating layer. The barrier height depends, in turn, upon the electronegativity difference between the materials. Thus, for an IGFET having a Si substrate and an $SiO_2$ insulating layer, the $SiO_2$ insulating layer is more electronegative than the Si substrate such that a dipole layer is produced at the Si—$SiO_2$ interface. The dipole layer, in turn, determines the relative positions of the band gaps of the two materials and, consequently, the barrier height therebetween. Accordingly, in order to obtain a measure of the expected performance of the IGFET and a measure of the reliability and quality of the fabrication process of the IGFET, the barrier height between the substrate and the insulating layer of an IGFET is measured.

The barrier height of a semiconductor device was initially measured by illuminating a partially transparent electrode of a metal oxide semiconductor (MOS) capacitor with light of varying frequencies and measuring the frequency of the incident light at which electrons surmount the energy barrier and are injected into the oxide layer. See R. Williams, *Physics Review*, Vol. 140, A569 (1965). Based upon the energy of the incident light at which electrons are injected into the oxide layer, a photoemission threshold or barrier height between the valence band of the semiconductor substrate and the conduction band of the oxide layer was determined.

Another conventional method of measuring the barrier height of a MOSFET is described in a textbook entitled *MOS (Metal Oxide Semiconductor) Physics and Technology* by coauthors E. H. Nicollian and J. R. Brews, pp. 452–62, John Wiley & Sons, New York (1982). See also C. A. Mead, et al., *Applied Physics Letters*, Vol. 9, 53 (1966); W. Ludwig, et al., *Physics Status Solidi*, Vol. 24, K137 (1967); and A. M. Goodman, *Physics Review*, Vol. 144, 588 (1966). According to this method, a semiconductor device is illuminated and the resulting photocurrent is measured as a function of the wavelength of the incident light with the electric field of the insulating layer as a parameter. The quantum yield, typically defined as the number of injected electrons per absorbed photon, is then determined from the measured photocurrent spectrum with corrections made for light source intensity variations with photon energy and for the effects of optical interference. The quantum yield is then plotted as a function of photon energy and is extrapolated to zero yield to obtain the barrier height corresponding to the chosen electric field of the insulating layer. Finally, the barrier heights thus obtained are plotted as functions of the electric field of the insulating layer and extrapolated to a zero electric field to get the zero field barrier height.

An alternative method of determining the barrier height of a semiconductor service is also described in the textbook entitled *MOS (Metal Oxide Semiconductor) Physics and Technology* by E. H. Nicollian, et al. See also R. J. Powell, *Journal of Applied Physics*, Vol. 41, 2424 (1970). According to this alternative method, the electric field of the insulating layer is treated as a variable with the photon energy as the parameter. In order to determine barrier height, the photocurrent V–I characteristics of the semiconductor device are plotted directly for different photon energies. The barrier height and dependence of the barrier height upon the electric field of the insulating layer are then determined by the extrapolation of the $V^{1/2}$–$I^{1/p}$ characteristics (wherein p=2 or 3) to zero photocurrent. Alternatively, the barrier height alone can be determined by simply examining the second derivative of the V–I characteristics for a sign change.

However, all of these measurements determine the barrier height based upon an extrapolation from values measured upon the application of high electric fields. Further, none of these methods determine a distribution of barrier height caused by disorder in the insulator layer. The degree of disorder of interfaces may be determined by infrared spectroscopy, Raman spectroscopy and index of refraction measurements. However, the prior methods of determining the degree of disorder of an interface and the corresponding barrier height distribution of a semiconductor device typically determine the degree of disorder averaged over a volume which makes these methods relatively insensitive to variations in the degree of disorder or variations in barrier height. Therefore, the measured parameters vary only slightly due to differences in the degree of disorder or variations in the barrier height.

Because, the barrier height in a semiconductor device, such as an IGFET is not generally constant, but is, instead, defined by a distribution of varying barrier heights, a more accurate measurement of the barrier heights of a semiconductor device is desirable. In addition, it is desirable to measure and detect small variations in the barrier height or small changes in the degree of disorder of an interface of a semiconductor device such that minor variations in the performance of the device or slight fluctuations in the fabrication process or the properties of the materials comprising the semiconductor device may be discovered.

SUMMARY OF THE INVENTION

It is an object of the present invention to provide an improved method and apparatus for determining the barrier height distribution of an IGFET.

It is another object of the present invention to provide an improved method and apparatus for measuring variations in the electric field in an insulator layer of an IGFET.

It is a further object of the invention to provide an improved method and apparatus for measuring the photocurrent collected under a gate electrode of an IGFET.

A method and apparatus of measuring the barrier height distribution in an IGFET according to the present invention includes applying a gate bias to a gate electrode and varying a back gate bias to a back gate electrode while generating electrons in the IGFET substrate, such as by intermittently illuminating a partially transparent gate electrode or by alternately applying a forward and reverse biases to source and drain electrodes.

The barrier height distribution in the IGFET is determined based upon the inverse Laplace transform of a ratio of the current conducted by the gate electrode to the current conducted by the source and drain electrodes of the IGFET. Based upon the Laplace transform, the barrier height averaged over an interfacial plane, and the variance of a distribution of barrier heights, such as a Gaussian distribution of barrier heights, are determined such that variations in the degree of disorder are discovered.

The IGFET has drain, gate and source electrodes formed on drain, gate and source regions of the transistor, respectively, and a back gate electrode formed on a surface of a semiconductor substrate opposite the gate region. During the intermittent illumination of the partially transparent gate electrode, the source and drain electrodes of the IGFET are electrically connected to one another.

According to another aspect of the present invention, variations in the electric field in an insulator layer of an IGFET due to charge generation in the insulator layer are compensated. In particular, this aspect of the present invention includes adjusting the gate bias to compensate for variations in the electric field. More specifically, the nominal threshold voltage of the transistor is determined for each predetermined back gate bias. A voltage source then applies a predetermined gate bias to the gate electrode, a predetermined back gate bias to the back gate electrode, and a first predetermined voltage to the drain electrode. A first change in threshold voltage from the nominal threshold voltage is then determined based upon the current conducted by the drain electrode and the gain factor of the IGFET.

Thereafter, the at least partially transparent gate electrode is preferably illuminated while the predetermined gate and back gate biases are applied, and the source and drain electrodes are electrically connected. The resulting current conducted by the gate electrode and the resulting current conducted by the connected source and drain electrodes are measured. The illumination is then removed and the source and drain electrodes are disconnected, prior to applying a second predetermined voltage to the drain electrode. A second change in threshold voltage from the nominal threshold voltage is then determined based upon the resulting current conducted by the drain electrode and the gain factor of the transistor. The gate bias is finally adjusted to compensate for variations in the electric field of the insulator layer of the IGFET based upon the difference between the first and second changes in the threshold voltage.

The nominal threshold voltage is preferably determined by applying a varying back gate bias to the back gate electrode and measuring the resulting current conducted by the drain electrode for each back gate bias applied. Based upon the measured current conducted by the drain electrode, the nominal threshold voltage for each back gate bias applied may be determined.

In addition, the gain factor of the IGFET which results from the application of a predetermined voltage to the drain electrode is measured by measuring the current conducted by the drain electrode due to the application of the predetermined voltage to the drain electrode. The gate bias is then momentarily increased and the resulting current conducted by the drain electrode is again measured. The resulting gain factor of the IGFET is then determined based upon the change in gate bias and the resulting change in current conducted by the drain electrode.

Typically, the gate bias is adjusted to compensate for variations in the electric field in the insulator layer of a IGFET if the difference between the first and second changes in threshold voltage is greater than a predetermined amount. The amount of the adjustment is preferably equal to the first change in threshold voltage from the nominal threshold voltage.

According to the present invention, the back gate bias is preferably varied from a first back gate bias to a second back gate bias. The first and second back gate biases are preferably selected such that the IGFET is free from free carrier multiplication, a portion of the electrons generated by the illumination have a Boltzmann energy distribution, and the resulting current conducted by the gate electrode is greater than a predetermined noise level for each back gate bias applied.

The gate bias is also preferably sufficient to maintain the transistor in inversion for each back gate bias applied. In particular, the gate bias applied is preferably as large as the threshold voltage of the IGFET resulting from the application of the smallest back gate bias. The gate bias also can be adjusted such that the barrier height distribution is measured in another plane defined within the insulator layer, and spaced apart from the interface of the semiconductor substrate and the insulator layer.

The present invention also includes measuring the photocurrent collected under the gate electrode. The photocurrent collected under the gate electrode is preferably measured by electrically connecting the source and drain electrodes together and applying a first voltage to the gate electrode to bias the IGFET into accumulation. As the first voltage is applied to the gate electrode, the partially transparent gate electrode is illuminated, and the resulting first current conducted by the connected source and drain electrodes is measured. Thereafter, a second voltage is applied to the gate electrode to bias the IGFET into inversion, and the partially transparent gate electrode is illuminated. The resulting second current conducted by the connected source and drain electrodes is again measured, and the photocurrent collected under the gate electrode is determined based upon the difference between the first and second measured currents.

Therefore, the barrier height distribution in a semiconductor device, such as an IGFET, may be readily determined. In particular, the average barrier height and the variance of a distribution of barrier heights can be determined by the present invention. Furthermore, the measurements from which the barrier height is determined are sensitive to minor variations in the degree of disorder of a material such that variations in the performance of the semiconductor device or fluctuations in the fabrication process or the properties of the materials comprising the device may be discovered according to the present invention. In addition, the present invention compensates for variations in the electric field of the insulator layer of a transistor, including variations introduced by charge generation therein.

DETAILED DESCRIPTION OF THE PREFERRED EMBODIMENTS

Figure 1:
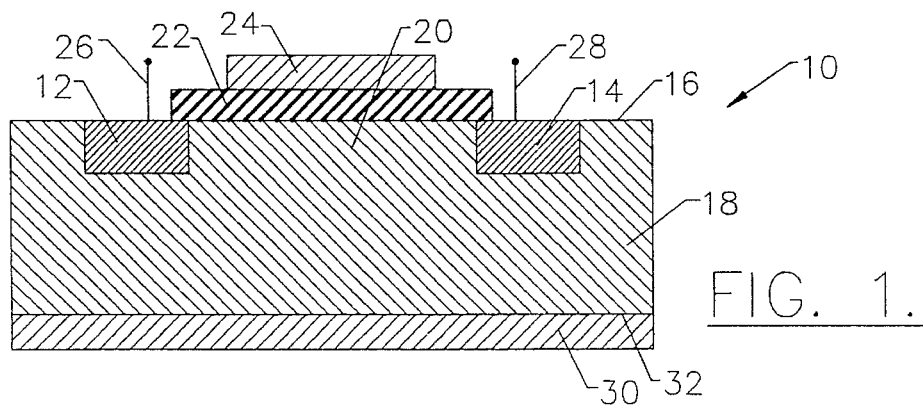
FIG. 1 is a cross-sectional view of a greatly enlarged IGFET.

In the drawings and the following detailed description, preferred embodiments of the invention are described in detail. Although the invention is described with reference to specific preferred embodiments, it will be understood that the invention is not limited to these preferred embodiments. But to the contrary, the invention includes numerous alternatives, modifications and equivalents as will become apparent from the consideration of the foregoing discussion and the following detailed description.

As illustrated in FIG. 1, a transistor 10, such as an insulated gate field effect transistor (IGFET), has drain and source regions 12 and 14, respectively, formed in a first face 16 of a semiconductor substrate 18 to define a channel 20 therebetween. For example, the drain and source regions 12 and 14 may be $n^+$-doped regions formed in a p-doped Si substrate while the drain and source regions are referred to hereinafter, the drain and source regions may be reversed due to the symmetry of the IGFET without departing from the present invention. In addition, the source and drain electrodes are also referred to as controlled electrodes herein.

An insulator layer 22, typically comprised of an oxide such as $SiO_2$, is formed between the source and drain regions 12 and 14 on the first face 16 of the semiconductor substrate 18. A gate or controlling electrode 24, typically comprised of conductive material, such as degeneratively doped polysilicon and/or metal, is formed on the insulator layer 22 between the source and drain regions 12 and 14. The gate electrode 24 is at least partially transparent. For example, the partially transparent gate electrode 24 may be comprised of a thin layer of polycrystalline Si, typically 0.3 μm or less in thickness. Other forms of partially transparent gate electrodes are well known to those having skill in the art.

The IGFET 10 also includes source and drain electrodes 26 and 28, respectively, formed on the source and drain regions, respectively, on the first face 16 of the semiconductor substrate 18 for making electrical contact with the source and drain regions, respectively. In addition, the IGFET includes a back gate electrode 30 on a second face 32, opposite the first face 16 of the semiconductor substrate 18, for establishing electrical contact with the substrate.

While an exemplary IGFET comprised of specific materials is described, the present invention may be applied to semiconductor devices, such as IGFETs, comprised of a variety of materials known to those skilled in the art. In addition, while an IGFET having a p-doped substrate is described, the present invention may also be applied to semiconductor devices having n-doped substrates to determine the barrier height distribution between the valence bands of the substrate 18 and the insulator layer 22.

Figure 2:
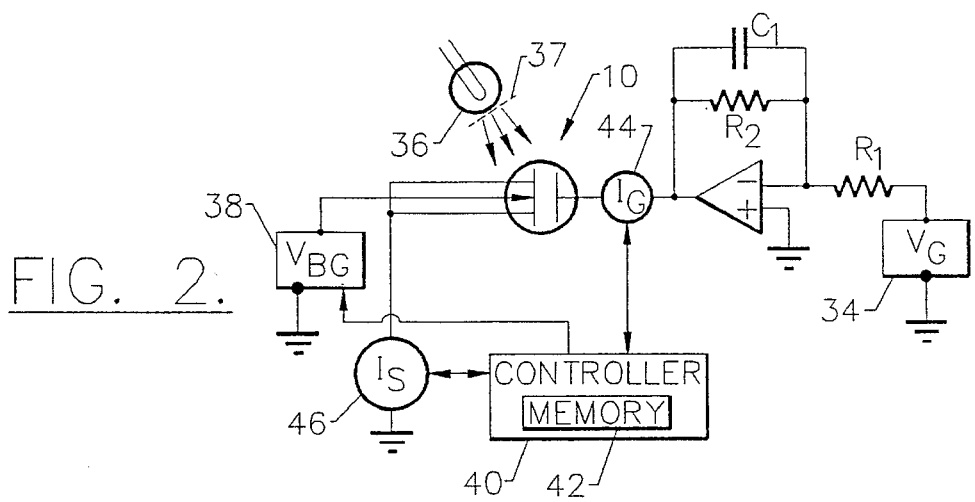
FIG. 2 is a schematic representation of a first system employed to measure the barrier height distribution in an IGFET according to the invention including illumination means for illuminating the partially transparent gate electrode of the IGFET.
Figure 6:
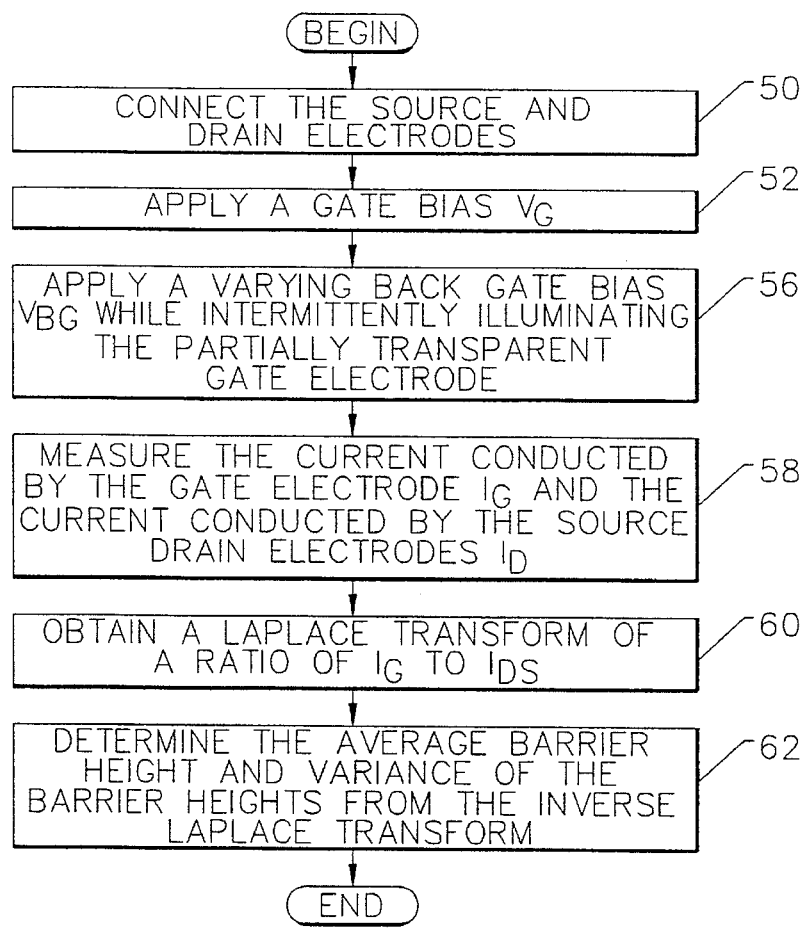
FIG. 6 is a flow chart illustrating the operations for measuring the barrier height distribution in an IGFET according to the present invention.

The barrier height between the conduction band of the semiconductor substrate 18 and the conduction band of the insulator layer 22 of the IGFET is determined according to the present invention by electrically connecting the source and drain electrodes 26 and 28 and applying a gate bias $V_G$ to the gate electrode 24, as shown in blocks 50 and 52 of FIG. 6. The gate bias is applied by a voltage source such as, for example, the operational amplifier circuit as illustrated in FIG. 2 and including a gate voltage source 34. The resistance and capacitance values of the circuit of FIG. 2 can vary without departing from the spirit and scope of the present invention, however, in one embodiment, the resistance value of the first resister $R_1$ is 62 kilohms, the resistance value of the second resister $R_2$ is 62 kilohms and the capacitance value of capacitor $C_1$ is 680 picofarads.

While the gate bias $V_G$ and backgate bias $V_{BG}$ are applied, electron-hole pairs are generated in the semiconductor substrate 18 such that the number of electrons which are injected into the gate insulator layer 22 is measurable. In one embodiment, the partially transparent gate electrode 24 is intermittently illuminated as shown in block 56, such as with an illuminating means 36, such as a halogen lamp, focused on the partially transparent gate electrode through a microscope. Typically, light having a wavelength within a range of from about 360 nanometers to about 600 nanometers and having a corresponding energy of from about 3.4 eV to about 2.1 eV is focused on the IGFET. In addition, the light is intermittently illuminated such that the electric field in the insulator layer 22 can be held relatively constant.

While the method and apparatus of the present invention will be described in conjunction with the intermittent illumination of the gate electrode 24, other methods of generating electrons within the semiconductor substrate 18 can be employed without departing from the spirit and scope of the present invention. For example, electrons can be generated in the semiconductor substrate 18 by applying a forward bias to both the source and drain electrodes 26 and 28. More specifically, alternating forward and reverse biases are preferably applied to the source and drain electrodes 26 and 28 of this embodiment such that the electric field in the insulator layer 22 can be held relatively constant as described above.

As also shown in FIGS. 2 and 6, a varying back gate bias $V_{BG}$ is applied to the back gate electrode 30 while the partially transparent gate electrode is intermittently illuminated as illustrated in block 56. For example, $V_{BG}$ may be applied by a back gate voltage source 38 which is controllably connected to a controller 40. The controller 40 typically controls the range of back gate biases $V_{BG}$ to be applied and the rate at which $V_{BG}$ is varied. Such information is generally stored in a memory device 42 associated with the controller 40.

The resulting current $I_G$ conducted by the gate electrode 24 and the resulting current $I_{DS}$ conducted by the connected source and drain electrodes 26 and 28 is measured as shown in block 58 of FIG. 6. These currents may be measured, for example, by electrometers as illustrated schematically as blocks 44 and 46, respectively, in FIG. 2.

As illustrated in blocks 60 and 62 of FIG. 6, the barrier height distribution in the IGFET may then be determined based upon the inverse Laplace transform of a ratio of the measured current $I_G$ conducted by the gate electrode 24 and the measured current $I_{DS}$ connected by source and drain electrodes 26 and 28 as follows:

$$\frac{I_G}{I_{DS}} = c \int_0^\infty \exp(-\beta\phi)P(\phi)d\phi \quad (1)$$

wherein c is a constant; $\phi$ is the barrier height, $\beta$ is the argument of the Laplace transform and is equal to the inverse of the electron energy, and $P(\phi)$ is the distribution of barrier heights. By inverting the Laplace transform and solving for $\phi$, the barrier height in this IGFET is determined.

The barrier height in an IGFET is typically defined by a distribution of individual barrier heights, $P(\phi)$. This distribution of barrier heights is generally a Gaussian distribution such that the logarithm of the Laplace transform of equation (1) yields:

$$\ln[cP(\beta)] = \ln(c) - \beta\phi_a + \frac{\beta^2\sigma^2}{2} \quad (2)$$

wherein $\phi_a$ is the average barrier height, $\sigma^2$ is the variance of the distribution, and $P(\beta)$ is the integral of equation (1).

The average barrier height $\phi_a$ and the variance $\sigma^2$ of the barrier height distribution are determined from equation (2) by measuring the ratio of $I_G$ to $I_{DS}$ over a range of $\beta$ which, as described hereinafter, are related to the varying back gate biases $V_{BG}$. By plotting the natural logarithm of the ratio of $I_G$ to $I_{DS}$ versus $\beta$ and performing a least squares fit curve through the plotted values, a curve representative of the natural logarithm of $cP(\beta)$ is obtained. Thereafter, the equation defining the least squares fit curve is obtained, such as by employing conventional software known to those skilled in the art which determines the equation of a least squares fit curve. Because the distribution of barrier heights is typically Gaussian, the equation defining the least squares fit curve is generally a second order equation. Therefore, the average barrier height $\phi_a$ and the variance $\sigma^2$ of the barrier height distribution may be determined by equating equation (2) with the equation defining the least squares fit curve.

While in an IGFET having a Gaussian distribution of barrier heights as described herein, the present invention also may determine the barrier heights in an IGFET which are distributed according to a non-Gaussian distribution. In these instances, the logarithm of the ratio of $I_G$ to $I_{DS}$ versus $\beta$ is plotted and a least squares fit curve is again constructed through the plotted values. The Laplace transform is then inverted and equated to the equation defining of the least squares fit curve to determine the barrier height distribution as described above.

Figure 7:
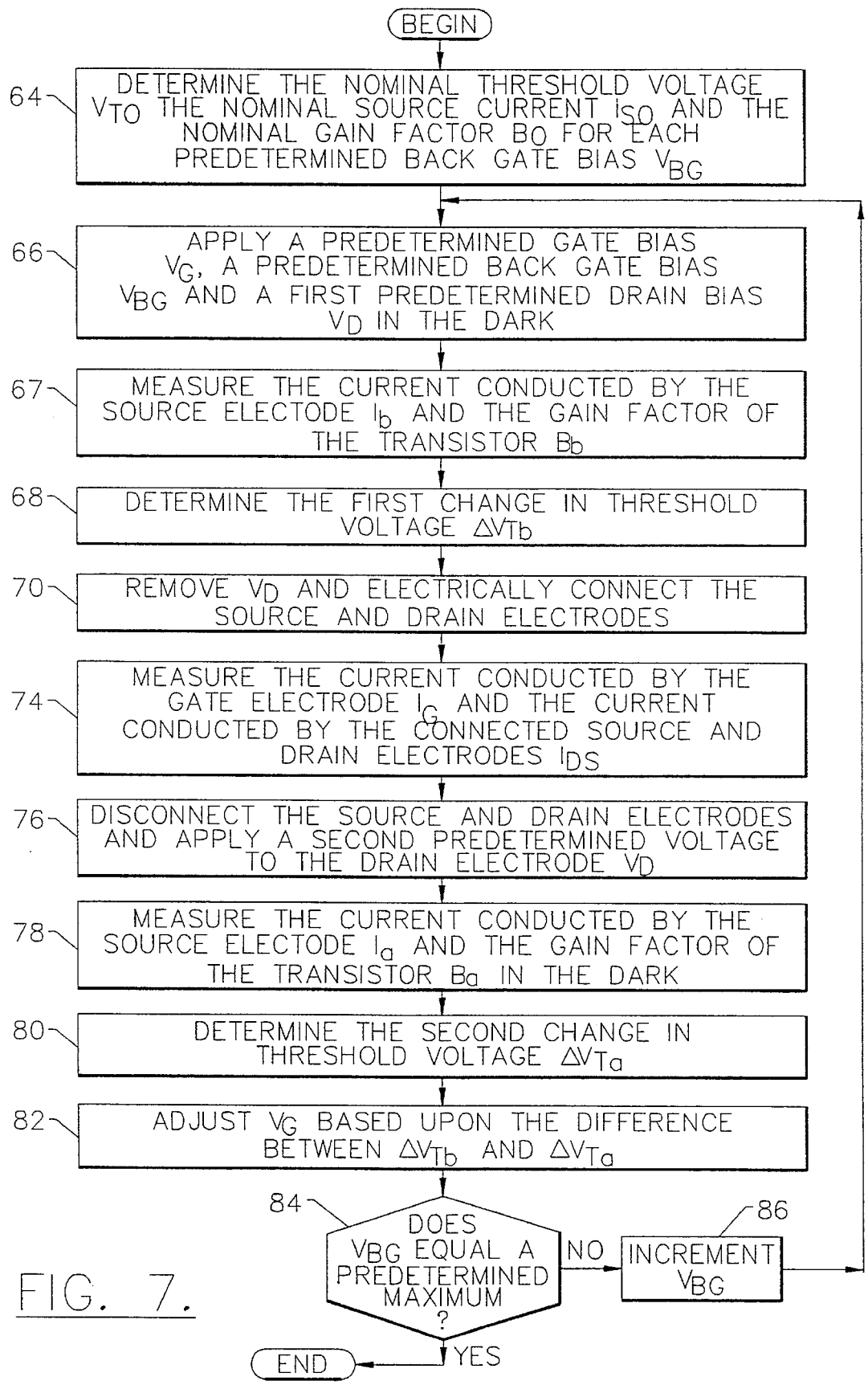
FIG. 7 is a flow chart illustrating in more detail, operations for applying and adjusting the gate bias according to the present invention to compensate for variations in the electric field of the insulator layer of the IGFET due to charge generation within the insulator layer.

In order to ensure that the current conducted by the gate electrode 24 and the current conducted by the connected source and drain electrodes 26 and 28 are reflective of the barrier height distribution in the IGFET, the present invention also preferably includes means for compensating for variations in the electric field in the insulator layer 22 of the IGFET due to charge generation in the insulator layer as shown in FIG. 7. In particular, the electrons injected into the insulator layer may be trapped, such as by oxide traps, within the insulator layer or these traps may be depopulated by field emission.

While the density of the generated charge is typically relatively small, the generated charge can appreciably alter the electric field in the insulator layer 22 during measurement of the currents conducted by the gate electrode 24 and by the connected source and drain electrodes 26 and 28. The generated charge typically increase the electric field in the insulator layer 22 and, therefore, lower the measured value of the barrier height.

In addition, variations in the electric field in the insulator layer 22 appear to make the electric field dependent on $\beta$. This apparent functional dependence of the electric field in the insulator layer 22 on $\beta$ makes the equation defining the natural logarithm of the Laplace transform a polynomial of third or greater order which has coefficients which are difficult to determine and to control. In addition, by attempting to fit such a higher order polynomial by a second order polynomial, such as equation (2), errors in the determined values of the average barrier height and the variance of the barrier heights are created.

Accordingly, the present invention preferably compensates for variations in the electric field in the insulator layer 22 due to charge generation therein. The change in charge density in the insulating layer 22 and the resulting change in the electric field is determined from the change in the threshold voltage $V_T$ of the IGFET. As known to those skilled in the art, the threshold voltage $V_T$ is the voltage applied between the gate and source electrodes 24 and 26 at which a channel is formed and current is conducted by the IGFET. As also known to those skilled in the art, the change in threshold voltage of an IGFET is directly proportional to the first moment of the change in charge density of the insulator layer.

In order to determine the change in threshold voltage, the source current Is conducted by the source electrode 26 is measured in the dark, i.e., without illumination of the partially transparent gate electrode 24 both prior to and after illumination of the IGFET. The source current $I_S$ is measured in the dark because the photocurrent produced by the illumination of the partially transparent gate electrode would comprise a significant portion of the total source current if measured during illumination. Based upon the change in threshold voltage determined by the change in source current $I_S$ conducted by the source electrode 26 before and after illumination of the IGFET, the gate bias $V_G$ is altered to compensate for variations in the charge density in the insulator layer 22.

Figure 3:
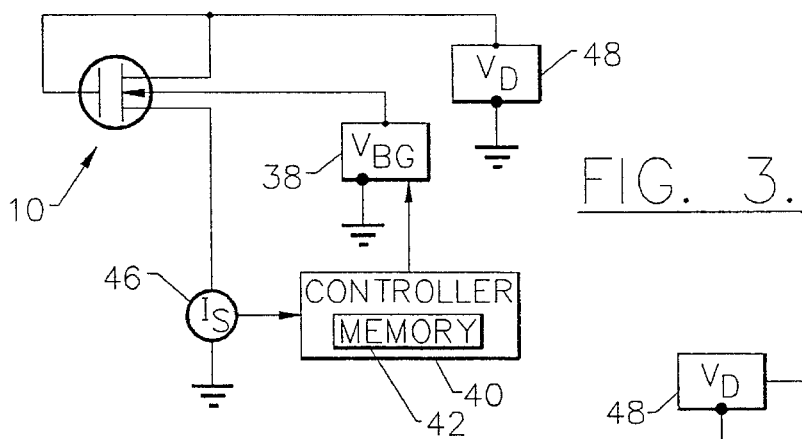
FIG. 3 is a schematic representation of a second system employed to measure the barrier height distribution in an IGFET according to the present invention.
Figure 8:
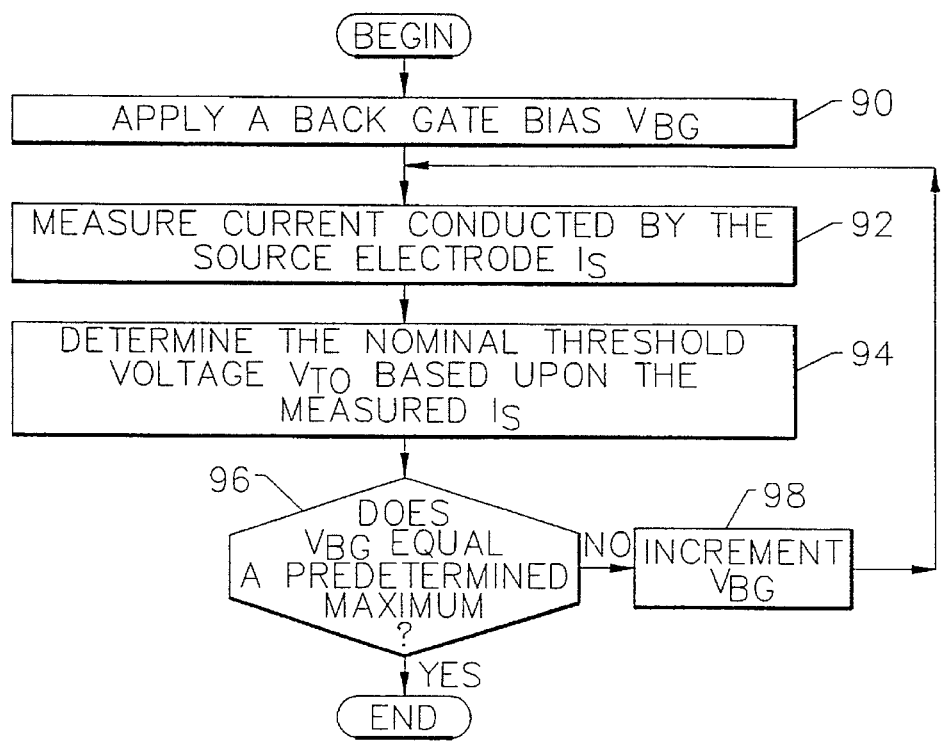
FIG. 8 is a flow chart illustrating operations of determining the nominal threshold voltage of the IGFET upon the application of varying back gate biases in the dark according to the present invention.

As illustrated in block 64 of FIG. 7 and in more detail in FIG. 8, the nominal threshold voltage $V_{TO}$ of the IGFET is determined for each of the predetermined back gate biases $V_{BG}$ applied to the back gate electrode 30. In order to determine the nominal threshold voltages $V_{TO}$, the IGFET is configured as illustrated in FIG. 3. As shown in FIG. 3, the gate electrode 24 is electrically connected to the drain electrode 28 such that the IGFET is saturated, that is, the source current $I_S$ is constant for a given voltages applied between the gate and the drain electrode 24 and 28. A varying back gate bias $V_{BG}$ is applied to the back gate electrode 30 and the resulting current conducted by the source electrode $I_S$ for each back gate bias $V_{BG}$ is measured as shown in blocks 90 and 92 of FIG. 8.

Thereafter, the nominal threshold voltage $V_{TO}$ for each back gate bias $V_{BG}$ is determined based upon the measured source current $I_S$ as illustrated in block 94. In particular, by plotting $I_S^{1/2}$ vs. $V_{BG}$ and extrapolating the linear portion of the curve to $I_S=0$, the nominal threshold voltage $V_{TO}$, at each back gate bias $V_{BG}$ is determined. As also shown in blocks 96 and 98 of FIG. 8, the foregoing process is repeated and the nominal threshold voltage $V_{TO}$ is determined for each back gate bias $V_{BG}$.

Figure 4:
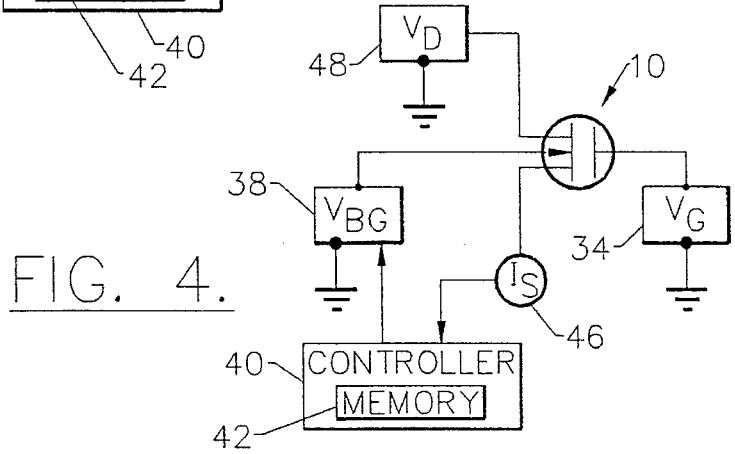
FIG. 4 is a schematic representation of a third system employed to measure the barrier height distribution in an IGFET according to the present invention.

As also shown in block 64, the nominal source current $I_{SO}$ and the nominal gain factor of the transistor $\beta_O$ are also determined for each back gate bias $V_{BG}$ prior to illuminating the partially transparent gate electrode 24 and injecting electrons into the insulating layer 22. Thus, the nominal source current $I_{SO}$ and the nominal gain factor $\beta_O$ are also determined in the dark, i.e., without illuminating the partially transparent gate electrode. In particular, the IGFET is configured as shown in FIG. 4 with a predetermined gate bias $V_G$ applied to the gate electrode 24, a predetermined back gate bias $V_{BG}$ applied to the back gate electrode 30, and a predetermined drain voltage $V_D$ applied to the drain electrode, such as by a drain voltage source 48. The resulting source current $I_{SO}$ is then measured.

Figure 9:
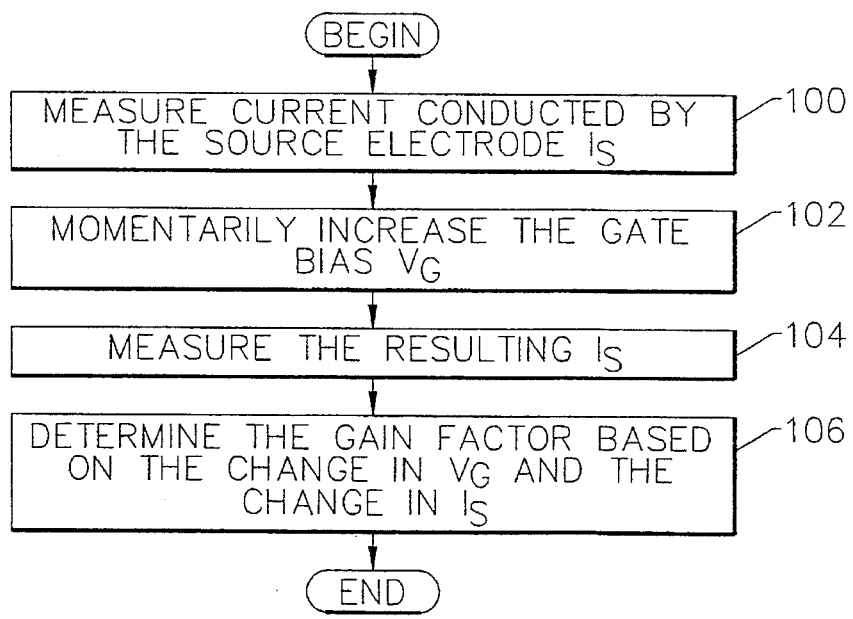
FIG. 9 is a flow chart illustrating the operations of measuring the gain factor of the IGFET in the dark according to the present invention.

The nominal gain factor $\beta_O$ of the IGFET is also measured as illustrated in FIG. 9. More specifically, the nominal gain factor $\beta_O$ of the IGFET is measured measuring the source current $I_S$ for a predetermined gate bias $V_G$ and back gate bias $V_{BG}$ as shown in block 100. The gate bias $V_G$ is then momentarily increased by 0.1 V and the resulting source current $I_S$ is measured as shown in blocks 102 and 104. The gain factor is then determined as shown in block 106 as follows:

$$\text{gain factor} = \frac{1}{V_D} \left( \frac{\Delta I_S}{\Delta V_G} \right) \quad (3)$$

wherein $\Delta I_S$ is the change in source current produced by the change in gate bias $\Delta V_G$ and $V_D$ is the first predetermined voltage applied to the drain electrode, such as 0.2 V, for example. The determination of $\beta_O$ is also conducted in the dark, i.e., without illuminating the partially transparent gate electrode.

Once the nominal threshold voltage $V_{TO}$, the nominal source current $I_{SO}$ and the nominal gain factor $\beta_O$ have been determined for each back gate bias $V_{BG}$, the gain factor and source current $I_S$ are both measured before and after illuminating the partially transparent gate electrode 24 during the application of each predetermined back gate bias $V_{BG}$. Accordingly, the change in threshold voltage from the nominal threshold voltage $V_{TO}$ upon the application of each back gate bias $V_{BG}$ may be determined both before and after the illumination of the partially transparent gate electrode. In turn, the amount by which the gate bias $V_G$ is to be adjusted to compensate for fluctuations in the electric field of the insulating layer 22 is determined.

In particular, for each back gate bias $V_{BG}$, the IGFET is again configured as shown in FIG. 4 prior to illuminating the partially transparent gate electrode 24. As shown, a predetermined gate voltage $V_G$ is applied to the gate electrode 24 and a first predetermined voltage $V_D$, such as 0.2 volts, is applied to the drain electrode 28 as shown in block 66. The resulting current $I_{Sb}$ conducted by the source electrode 26 is then measured. The gain factor $\beta_b$ of the IGFET is also measured, as described above, prior to illuminating the partially transparent gate electrode 24.

Based upon the nominal source current $I_{SO}$, the nominal gain factor $\beta_O$, the measured source current $I_{Sb}$ and the measured gain factor $\beta_b$ of the transistor, a first change in threshold voltage $\Delta V_{Tb}$ from the nominal threshold voltage $V_{TO}$ may be determined as shown in block 68. In particular, the first change in threshold voltage $\Delta V_{Tb}$ is determined as follows:

$$\Delta V_{Tb} = \left[ 1 - \left( \frac{B_O}{B_b} \right) \left( \frac{I_{Sb}}{I_{SO}} \right) \right] (V_G - V_{T_o}) \quad (4)$$

Thereafter, the IGFET is configured as illustrated in FIG. 3 wherein the source and drain electrodes 26 and 28 are electrically connected as illustrated in block 70. The partially transparent gate electrode 24 is then illuminated while the predetermined gate and back gate biases are applied to the gate and back gate electrodes, respectively, as shown in block 72. The resulting current $I_G$ connected by the gate electrode 24 and the resulting current $I_{DS}$ conducted by the connected source and drain electrodes 26 and 28 are measured as shown in block 74.

Subsequently, the IGFET is reconfigured as illustrated in FIG. 4 and the illumination is removed. A second predetermined voltage $V_D$ is applied to the drain electrode 28 by the drain voltage source 48 and the resulting current $I_{Sa}$ connected by the source electrode 26 and the gain factor $\beta_a$ of the transistor are measured as described hereinabove and as shown in blocks 76 and 78, respectively. The second predetermined voltage applied to the drain electrode 28 is preferably equal to the first predetermined voltage applied to the drain electrode, such as, for example, 0.2 V. Thereinafter, the second change in threshold voltage $\Delta V_{Ta}$ may be determined as illustrated in block 80 of FIG. 7 as follows:

$$\Delta V_{Ta} = \left[ 1 - \left( \frac{\beta_O}{\beta_a} \right) \left( \frac{I_{Da}}{I_{Do}} \right) \right] (V_G - V_{T_o}) \quad (5)$$

Thus, for each back gate bias, the changes in threshold voltage before and after illumination of the partially transparent gate electrode, $\Delta V_{Tb}$ and $\Delta V_{Ta}$, respectively, are determined.

Typically, if the difference between the change in threshold voltages measured before and after the illumination of the partially transparent gate electrode 24 exceeds a predetermined amount, the gate bias $V_G$ is adjusted to compensate for variations in the electric field of the insulator layer 22. For example, if $(\Delta V_{Ta} - \Delta V_{Tb})/V_{TO} \leq 0.05$, a voltage equal to the difference between $\Delta V_{Ta}$ and $\Delta V_{Tb}$ is preferably applied to the gate electrode 24 by the gate voltage source 34 to compensate for variations in the electric field of the insulator layer 22 as shown in block 82. If the difference in the changes in threshold voltages before and after the illumination of the partially transparent gate electrode is less than the predetermined value, the oxide charging may be considered negligible and a compensating voltage is not generally applied to the gate electrode.

In order to obtain a stable value of the change in threshold voltage, either $\Delta V_{Ta}$ or $\Delta V_{Tb}$, each change in threshold voltage is preferably repeatably measured until it no longer changes appreciably. For example, the change in threshold voltage is preferably repeatedly measured until it is within a predetermined percentage of the previous measurement, such as 5%.

Figure 5:
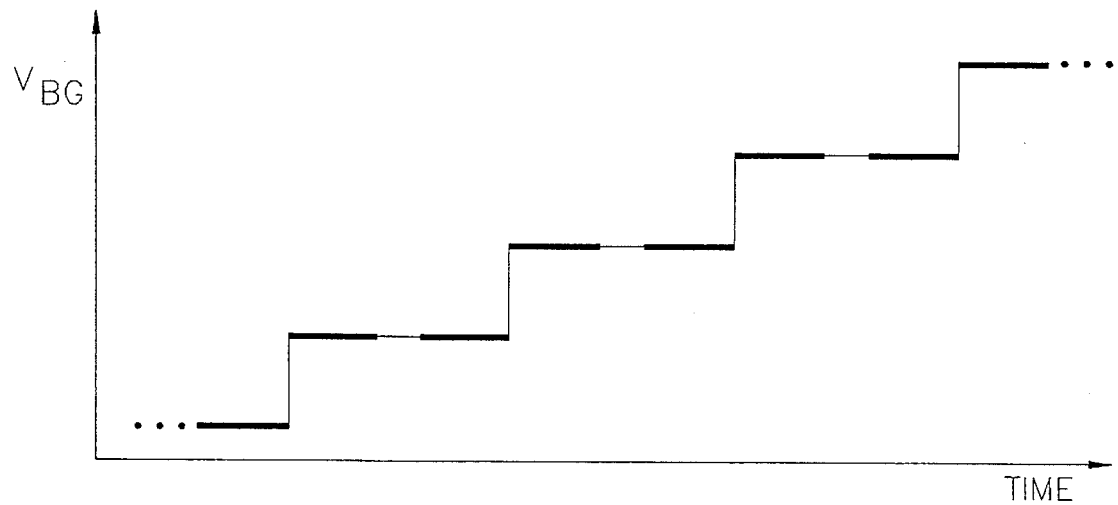
FIG. 5 is a graphical illustration of the intermittent illumination of the partially transparent gate electrode of an IGFET upon the application of varying back gate biases.

According to the present invention, a varying back gate bias $V_{BG}$ is applied to the IGFET in order to determine the barrier height distribution of the IGFET as described above. For example, the back gate bias $V_{BG}$ may be varied between an initial back gate bias and a final back gate bias according to a voltage staircase as shown in FIG. 5 in which a predetermined number of back gate biases, such as 30, are applied. These values of back gate bias $V_{BG}$ are preferably calculated from equally spaced values of the substrate electric field within the range of the substrate electric field as described in detail hereinafter, and are preferably applied for equal lengths of time.

In addition, the adjustment of the gate bias $V_G$ to compensate for variations in the electric field of the insulator layer 24 as described above is preferably performed for each back gate bias $V_{BG}$ as illustrated in block 84 of FIG. 6. Thus, as illustrated in FIG. 5, for each back gate bias, measurements of source current $I_{Sb}$ and gain factor $\beta_b$ are preferably performed in the dark prior to illuminating the partially transparent gate electrode 24. Subsequently, the partially transparent gate electrode 24 is illuminated and the resulting gate current $I_G$ and drain and source current $I_{DS}$ is measured. Additional measurements are then obtained in the dark after the illumination has been removed from the partially transparent gate electrode 24. While these periods may be of varying lengths, the interval in which the partially transparent gate electrode is illuminated can be one second in duration while each dark interval is approximately two seconds in duration, for example.

An electric field $E_S$ is established in the substrate 18, in part, by the application of a back gate bias $V_{BG}$. To determine the preferred values of $V_{BG}$ for application of the method of the present invention, the electric field of the substrate $E_s$ is initially varied through a plurality of equal increments, typically thirty or more increments, between predetermined upper and lower limits and to obtain the corresponding values of depletion layer width w for each value of $E_s$. As known to those skilled in the art, the electron and hole concentrations at the interface of the insulating layer 22 and semiconductor substrate 18 of a transistor in depletion are less than the doping concentration in the bulk region of the semiconductor substrate. Because the area of the gate electrode 24 is large relative to the thickness of the insulating layer 22, fringing fields can be neglected such that the electric field $E_s$ of the substrate 18 equals:

$$E_s = \frac{q}{\epsilon_s} \int_0^w N(x) dx \quad (6)$$

wherein x is the distance from the first face 16 of the substrate 18, N(x) is the doping profile of the semiconductor substrate, q is the electron charge in coulombs, and $\epsilon_s$ is the dielectric permittivity of the substrate, such as, $1.04 \times 10^{-12}$ F/cm for a $S_i$ substrate. As known to those skilled in the art, the doping profile N(x) can be accurately determined up to the first face 16 of the semiconductor substrate 18 by the Q-C method. See J. R. Brews and E. H. Nicollian, Solid-State Electronics, Vol. 27, No. 11, 1963 (1984). Equation (5) is then solved for depletion layer width w by the Newton-Raphson method. See, for example, L. A. Pipes, Applied Mathematics for Engineers and Physicists, p. 94, McGraw Hill Book Co., New York (1946).

The preferred back gate biases are then calculated by integrating equation (5) to yield:

$$V_{BG} = \frac{q}{\epsilon} \int_0^w x N(x) dx \quad (7)$$

wherein w is obtained from the solution of equation (6). The values of back gate biases $V_{BG}$ obtained from equation (7) are thus applied to the back gate electrode during measurement of the barrier height distribution of the IGFET as described above. It will be apparent to those skilled in the art, however, that other back gate biases $V_G$ may be applied without departing from the spirit and scope of the present invention.

The maximum electric field $E_s$ established in the substrate 18 and, thus, the maximum back gate bias is preferably selected such that free carrier multiplication in the substrate is prevented. Free carrier multiplication is preferably prevented because such multiplication may skew the electron energy distribution so as to introduce errors in the measured parameters, and cause an unnecessary increase in the electric field of the insulating layer 22.

In addition, the minimum electric field $E_s$ established in the substrate 18 and, thus, the minimum back gate bias is preferably large enough to produce a gate current $I_G$ which is greater than a predetermined noise level gate current, and to produce a Boltzmann electron energy distribution for the electrons that have a sufficiently high energy to surmount the barrier.

The gate bias $V_G$ is also preferably large enough to provide a drift field in the insulator layer for thermionically injected electrons. The gate bias $V_G$ also preferably maintains the IGFET in inversion over the entire range of back gate biases such that the electric field in the substrate $E_s$ is independent of the electric field of the insulator layer 22. The minimum gate bias $V_G$ required to maintain the IGFET in inversion is preferably larger than the maximum nominal threshold voltage $(V_{TO})_{max}$ of the IGFET within the range of back gate biases applied. Further, the maximum nominal threshold voltage of the IGFET is produced by application of the largest back gate bias $(V_{BG})_{max}$.

Upon illumination of the semitransparent gate electrode 24 and the application of a gate bias $V_G$, such as a positive gate bias to an IGFET having a p-doped substrate, for example, the short circuit photocurrent conducted by the source and drain electrodes 26 and 28 is typically the sum of the current collected under the gate and the current collected by the source and drain junctions. In order to properly determine the barrier height distribution in the IGFET, the value of the current conducted by the connected source and drain electrodes which is measured and employed in equation (1) should consist only of the photocurrent collected under the gate. In addition, equation (1) is only independent of the intensity of the light illuminating the partially transparent gate electrode if the current $I_{DS}$ conducted by the drain and source electrodes 26 and 28 consists only of the photocurrent collected under the gate.

Figure 10:
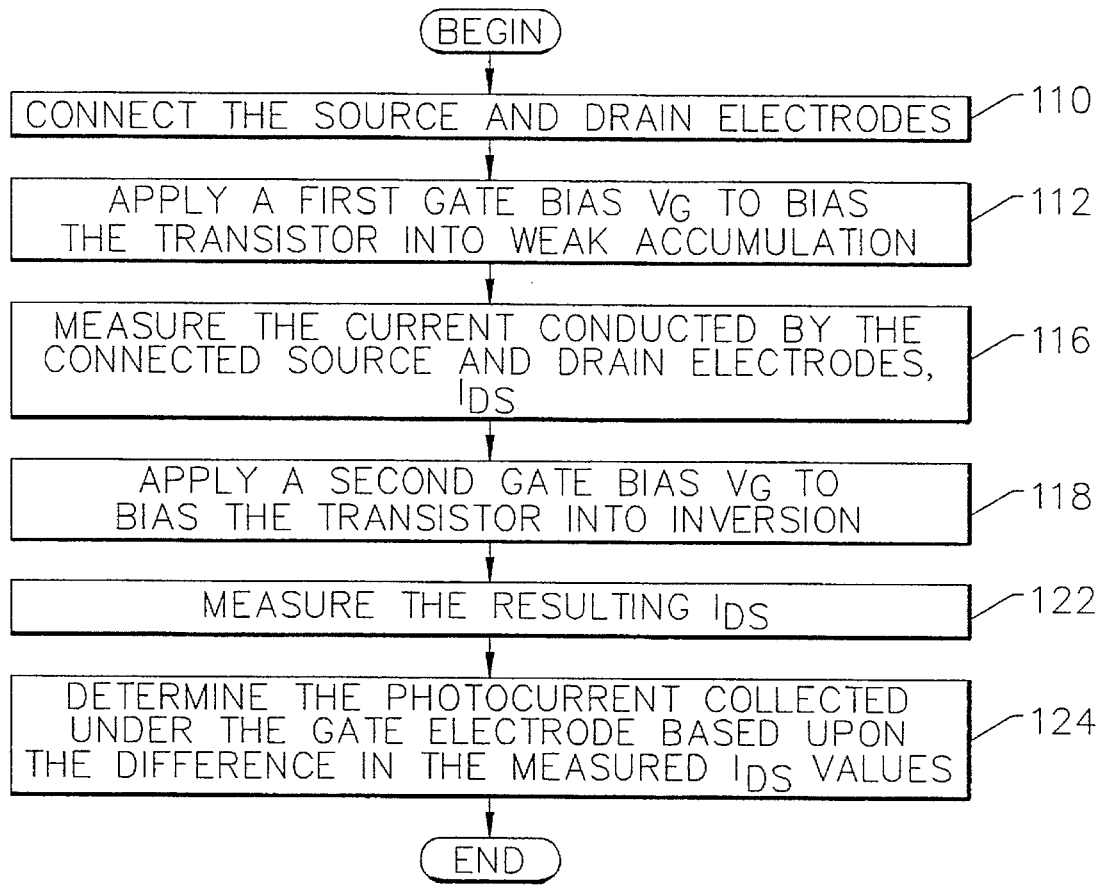
FIG. 10 is a flow chart illustrating the operations for measuring the photocurrent collected under the gate electrode according to the present invention.

As shown in blocks 110, 112 and 114 of FIG. 10, the photocurrent collected under the gate is separated from the total photocurrent by initially biasing the substrate 20 of the IGFET into weak accumulation while the source and drain electrodes 26 and 28 are connected, and the partially transparent gate electrode 26 is illuminated. For example, for an IGFET having a p-doped substrate, a negative gate bias is applied such that the electrons generated by the illumination when the substrate 20 is biased into weak accumulation are collected only by the source and drain junctions because there is an energy barrier between the accumulation layer and the n$^+$-doped source and drain junctions. As known to those skilled in the art, the majority carrier concentration, i.e., the hole carrier concentration for an p-doped semiconductor substrate, is greater near the interface of the insulating layer 22 and semiconductor substrate 18 in accumulation than in the bulk region of the semiconductor substrate. The current $I_{PJ}$ conducted by connected source and drain electrodes 26 and 28 is then measured as shown in block 116.

Thereafter, the semiconductor surface 16 is inverted, such as by the application of a positive gate bias $V_G$ to an IGFET having a p-doped substrate, and the current $I_{PT}$ conducted by the connected source and drain electrodes 26 and 28 which now is the sum of the photocurrent collected by the source and drain junctions and the photocurrent collected under the gate is measured while the partially transparent gate electrode 24 is illuminated. See, for example, blocks 118, 120 and 122 of FIG. 10. As also known to those skilled in the art, a channel having a relatively large concentration of minority carriers, such as electrons in a p-doped semiconductor substrate is established by inverting the transistor. Thus, the photocurrent $I_{DS}$ collected under the gate for each value of back gate bias $V_{BG}$ is determined as:

$$I_{DS}=I_{PT}-I_{PJ} \tag{8}$$

wherein $I_{PT}$ is the total short circuit photocurrent at positive gate bias $V_G$ when the semiconductor surface 16 is inverted and $I_{PJ}$ is the photocurrent collected by the drain and source junctions at negative gate bias when the semiconductor surface is in weak accumulation.

In order to properly measure the photocurrent collected under the gate $I_{DS}$, the semiconductor surface 16 must only be biased into weak accumulation, and not strong accumulation, because strong accumulation forms an n$^+$-p$^+$ junction at the semiconductor surface between the n$^+$-doped source and drain regions 12 and 14 and the p$^+$-field induced accumulation layer. Tunneling could occur across the n$^+$-p$^+$ junction which would contribute additional photocurrent to the current conducted by the source and drain electrodes 26 and 28 and would produce erroneous measurements. By biasing the semiconductor surface 16 only into weak accumulation, the accumulation layer is isolated from the source and drain regions 12 and 14 by an energy barrier for holes which is not breached by tunneling.

Both $I_{PT}$ and $I_{PJ}$ increase as the reverse bias applied to the back gate electrode 30 is increased. In addition, $I_{PT}$ is typically greater than $I_{PJ}$ until the measured photocurrent abruptly increases as the back gate bias $V_{BG}$ approaches the gate bias $V_G$. In particular, the weak accumulation layer disappears when the back gate bias $V_{BG}$ equals the gate bias $V_G$ and the semiconductor face 16 becomes depleted. Thus, the photocurrent collected under the gate $I_{DS}$ is obtained only over a portion of the range of back gate biases.

For an IGFET having a p-doped semiconductor substrate, the negative gate bias required to allow extraction of $I_{PJ}$ over a reasonable range of back gate bias without incurring significant tunneling is typically determined experimentally. Upon the application of a negative gate bias $V_G$, the back gate bias $V_{BG}$ is swept from its maximum value to its minimum value in the dark, i.e., without illuminating the partially transparent gate electrode 24, thus creating an accumulation layer at virtually the same potential as the substrate. The back gate bias therefore appears across the depletion layer between the accumulation layer and the n$^+$-doped source and drain regions 12 and 14. With the IGFET configured as shown in FIG. 2, the tunneling current is measured as a function of back gate bias $V_{BG}$ in the dark. The value of the back gate bias at which the tunneling current is three times the value of the tunneling current at the minimum back gate bias is determined. Typically, the gate bias $V_G$ applied during the determination of $I_{PJ}$ is one volt less than the minimum voltage of the back gate bias.

The measured current $I_{DS}$ conducted by the connected drain and source electrodes 26 and 28 decreases with increasing depletion layer widths w. It is believed that this decrease occurs because the source and drain junction depletion layer widths increase laterally under the gate electrode 24 with increasing reverse back gate bias. Thus, the source and drain junctions collect the photogenerated electrons at the expense of the field induced junction. To determine the relationship of $I_{DS}$ and w, the steady state electron photocurrent collected in a direction perpendicular to the first face 16 of the semiconductor substrate 18 is initially determined. See T. H. Ning, et al., "Injection Probability of Hot Electrons From Silicon Into Silicon Dioxide," *Journal of Applied Physics*, Vol. 48, 286 (1977); S. M. Sze, *Physics of Semiconductor Devices*, Ch. 12, § 4, John Wiley and Sons, New York (1969). The exponential decay of the absorbed light with distance into the semiconductor substrate is provided by:

$$G_L(x)=F_o \alpha \exp(-\alpha x) \tag{9}$$

wherein $G_L(x)$ is the hole-electron generation rate per cubic centimeter at a distance x into the semiconductor substrate 18 measured from the first face 16, $F_o$ is the total incident photon flux (cm$^{-2}$–s$^{-1}$) and $\alpha$ is an effective absorption coefficient (cm$^{-1}$), such as 4000 cm$^{-1}$ for a halogen lamp filament having a temperature of 3400° K. and transmitting at 70%, for example. The photocurrent density, $J_{DS}$, is calculated as:

$$J_{DS}=J_{drift}+J_{Diff} \tag{10}$$

wherein $J_{drift}$ is the photocurrent density of electrons generated in the depletion layer, and $J_{diff}$ is the photocurrent density of electrons generated beyond the depletion layer edge. The drift current density $J_{drift}$ is:

$$J_{drift}=-q\int_o^w G_L(x)dx \tag{11}$$

Substituting equation (9) into equation (11), and integrating yields:

$$J_{drift}=qF_o[1-\exp(-\alpha w)] \tag{12}$$

For distances into the semiconductor substrate 18 from the first face 16 greater than the depletion layer width, i.e., x>w, and assuming that the inversion layer width is small compared to the electron diffusion length so that hole collection can be neglected, the photogenerated electron diffusion current density $J_{diff}$ is:

$$J_{diff} = -qD_n \left[ \frac{\partial n_p(x)}{\partial n} \right]_{x=w} \quad (13)$$

wherein $n_p(x)$ is the photogenerated electron density and $D_n$ is the diffusion coefficient of the minority carriers, such as electrons in a p-type substrate. To determine $J_{diff}$ from equation (13), it is necessary to solve the diffusion equation:

$$D_n \frac{\partial^2 n_p(x)}{\partial x^2} - \frac{n_p(x) - n_{po}}{\tau_n} + G_L(x) = 0 \quad (14)$$

wherein $\tau_n$ is the electron lifetime and $n_{po}$ the equilibrium electron density in a p-type substrate, for example. The boundary conditions are: $n_p(\infty) = n_{po}$, and $n_p(0) = 0$. The result of solving equation (14) with these boundary conditions, and substituting into equation (13) is:

$$J_{diff} = \frac{qF_o \alpha L_n \exp(-\alpha w)}{(1 + \alpha L_n)} + qn_{po}\left(\frac{D_n}{L_n}\right) \quad (15)$$

wherein $L_n$ is the minority carrier diffusion length, such as the electron diffusion length in a p-type substrate. The last term $$\left[ \left( qn_{po}\left(\frac{D_n}{L_n}\right) \right) \right]$$

in equation (15) is negligible compared to the first term for typical light intensities. Thus, by substituting equation (15), with the second term neglected, and equation (12) into equation (10), the photocurrent density $J_{DS}$ is computed as:

$$J_{DS} = qF_o \left[ 1 - \frac{\exp(-\alpha w)}{1 + \alpha L_n} \right] \quad (16)$$

For white light from a halogen lamp, and typical n-channel MOSFET substrate doping densities, $\alpha w \gg 1$. Therefore, equation (16) can be reliably approximated as:

$$J_{DS} = \frac{qF_o \alpha L_n}{1 + \alpha L_n} \quad (17)$$

Taking into account the photocurrent collected along the semiconductor face 16 from the device geometry of the IGFET of FIG. 1 and equation (17), $I_{DS}$ is computed as:

$$I_{DS} = \frac{4qF_o\alpha L_n \lfloor [2Lz - L_n(Z+L) - (Z+L)W] \rfloor}{1 + \alpha L_n} \quad (18)$$

wherein Z is the gate width, and L is the channel length. Equation (18) demonstrates that $I_{DS}$ decreases linearly with the depletion layer width w, with a slope, m, of:

$$m = \frac{-qF_o\alpha L_n(Z+L)}{1 + \alpha L_n} \quad (19)$$

and an intercept $b_i$ at w=0 of:

$$b_i = \frac{4qF_o\alpha L_n[2LZ - L_n(Z+L)]}{1 + \alpha L_n} \quad (20)$$

The ratio of $b_i$ to m is:

$$r = \frac{b_i}{m} = \left[\frac{2LZ}{Z+L} - L_n\right] \quad (21)$$

Solving equation (21) for $L_n$ yields:

$$L_n = \frac{2LZ}{Z+L} - r \quad (22)$$

Thus, the minority carrier diffusion length $L_n$ is initially calculated based upon the predetermined device geometry of the IGFET. Using the slope m and intercept $b_i$ from equations (19) and (20), respectively, that were obtained from a fit of a graph of $I_{DS}$ vs. w that was extracted from measurements taken over a portion of the range of back gate biases, the photocurrent collected under the gate $I_{DS}$ can be extrapolated over the entire back gate bias range. Because the hole-electron photogeneration rate $G_{LO}$ equals $\alpha F_o$, equation (19) may be solved for $G_{LO}$ as follows:

$$G_{LO} = \frac{|m|(1 + \alpha L_n)}{4qL_n(Z+L)} \quad (23)$$

To determine $G_{LO}$, $\alpha$ must first be approximated. For a halogen lamp filament temperature of 3400° K., the black body radiation from the lamp peaks at a wavelength of 850 nm. However, a high pass filter 37 which does not transmit light at wavelengths in this range is preferably employed. Instead, at a wavelength of 600 nm where the transmission percentage of the filter is 70%, $\alpha$ is approximately 4000 cm$^{-1}$. See S. M. Sze, *Physics of Semiconductor Devices*, Ch. 12, § 4. Substituting the value of $L_n$ obtained from equation (22), and an $\alpha$ value of 4000 cm$^{-1}$ into equation (23), the value of $G_{LO}$ may be calculated for a predetermined light intensity.

The parameter $G_{LO}$ is related to the photogenerated electron density n as follows:

$$n = G_{Lo}\tau_n \quad (24)$$

wherein $\tau_n$ is the electron lifetime in the semiconductor substrate, such as 50 μs, for example. Preferably, n should be in the $10^{16}$ cm$^{-3}$ range to make electron-electron collisions highly probable so that the electrons which surmount the energy barrier have a Boltzmann energy distribution over the entire range of back gate biases $V_{BG}$.

Because $I_{DS}$ is the small difference between the two relatively large photocurrents $I_{PT}$ and $I_{PJ}$, any small fluctuations in light intensity are reflected as large fluctuations in $I_{DS}$. In order to minimize such light intensity fluctuations, however, the halogen microscope lamp is preferably powered by a constant current source.

Inversion layer electrons absorb light at photoenergies which are insufficient for electron-hole pair production. The free carrier light absorption is relatively small, but is important with respect to the measured photocurrent $I_{DS}$ because it depends on inversion layer electron density. In particular, free carrier absorption decreases, at a predetermined gate bias $V_G$, as the back gate bias $V_{BG}$ is increased which, in turn, decreases inversion layer electron density. The free carrier absorption causes the linear variation of $I_{DS}$ versus w as predicted by equation (18) to vary non-linearly. Therefore, it is more difficult to separate the photocurrent collected by the source and drain junctions $I_{PJ}$ from the total photocurrent $I_{PT}$ by the method described above. To minimize free carrier absorption by inversion layer electrons, the illuminating source preferably includes a high pass filter 37 that transmits about 70% of the incident light in the wavelength band from 360 nm to 600 nm. Preferably, the transmission decreases from 70% at a wavelength of 600 nm to below 0.1% at a wavelength of 840 nm at a rate of approximately 0.6%/nm.

The barrier height distribution may also be determined according to the present invention in other planes of the insulator layer 22, parallel to and spaced apart from the first face 16 of the semiconductor substrate 18, by varying the gate bias $V_G$. The barrier height varies as a function of the distance within the insulator layer 22 from the first face 16 of the substrate 18. In particular, the barrier height typically is greatest at a distance $X_{mo}$ within the insulating layer 22 from the first face 16. This distance $X_{mo}$ is determined as:

$$X_{mo} = \left( \frac{q}{16\pi\epsilon_i E_{ox}} \right)^{1/2}$$

wherein $\epsilon_i$ is $1.9\times10^{-13}$ F/cm and $E_{ox}$ is the electric field in the insulator layer. The distance $X_{mo}$ typically varies from 7.5 Å to 13 Å. Thus, the average barrier height $\phi_a$, and the variance ea of the distribution of barrier heights can be determined for a number of planes within the insulating layer 22 according to the present invention. Additional information regarding the fabrication and anticipated performance of the semiconductor device may therefore be obtained.

Therefore, the barrier height distribution in a semiconductor device, such as an IGFET, may be readily determined by the present invention. In particular, the average barrier height and the variance of a distribution of barrier heights can be determined. Furthermore, the measurements from which the barrier height distribution is determined are sensitive to variations in the degree of disorder of a material such that variations in the performance of the semiconductor device or fluctuations in the fabrication process or the properties of the materials comprising the device may be discovered according to the present invention. Accordingly, a figure of merit may be associated with each semiconductor device which can be used for comparison purposes with other semiconductor devices and as a measure of the anticipated performance of the device.

The invention has been described in considerable detail by reference to preferred embodiments; however, it will be apparent that numerous variations and modifications can be made without departing from the spirit and scope of the invention as described in the foregoing detailed specification and defined in the appended claims.

That which is claimed:

1. A method of compensating for variations in the electric field in an insulator layer of a insulated gate field effect transistor due to charge generation in the insulator layer, the transistor having drain, gate and source electrodes formed on drain, gate and source regions of the transistor, respectively, and a back gate electrode formed on a face of a semiconductor substrate opposite the gate region, the gate electrode being at least partially transparent, the method comprising the steps of:

determining a nominal threshold voltage of the transistor for each of a plurality of predetermined back gate biases applied to the back gate electrode;

applying a predetermined gate bias to the gate electrode, a predetermined back gate bias to the back gate electrode, and a first predetermined voltage to the drain electrode;

determining a first change in threshold voltage between the nominal threshold voltage and a threshold voltage as the first predetermined voltage is applied to the drain electrode;

electrically connecting the source and drain electrodes, illuminating the partially transparent gate electrode while the predetermined gate and back gate biases are applied to the gate and back gate electrodes, respectively, and measuring the current conducted by the gate electrode and the current conducted by the connected source and drain electrodes;

applying a second predetermined voltage to the drain electrode after disconnecting the source and drain electrodes;

determining a second change in threshold voltage between the nominal threshold voltage and a threshold voltage as the second predetermined voltage is applied to the drain electrode; and adjusting the gate bias applied to the gate electrode to compensate for variations in the electric field in the insulator layer of the transistor based upon the difference between the first and second changes in threshold voltage.

2. A method according to claim 1 wherein said nominal threshold voltage determining step comprises the steps of:

applying varying back gate biases to the back gate electrode;

measuring the current conducted by the drain electrode for each back gate bias applied; and determining the nominal threshold voltage for each back gate applied based upon the measured currents conducted by the drain electrode.

3. A method according to claim 1 wherein said step of determining the first change in threshold voltage of the transistor comprises the step of measuring the current conducted by the drain electrode and the gain factor of the transistor as the first predetermined voltage is applied to the drain electrode, and wherein said step of determining the second change in threshold voltage of the transistor comprises the step of measuring the current conducted by the drain electrode and the gain factor of the transistor as the second predetermined voltage is applied to the drain electrode.

4. A method according to claim 3 wherein said step of measuring the gain factor of the transistor resulting from the first predetermined voltage applied to the drain electrode comprises the steps of:

measuring the current conducted by the drain electrode due to the first predetermined voltage applied to the drain electrode;

momentarily increasing the gate bias applied to the gate electrode, and measuring the resulting current conducted by the drain electrode; and determining the resulting gain factor of the transistor based upon the change in gate bias and the resulting change in current conducted by the drain electrode due to the momentary increase in gate bias.

5. A method according to claim 3 wherein said step of measuring the gain factor of the transistor resulting from the second predetermined voltage applied to the drain electrode comprises the steps of:

measuring the current conducted by the drain electrode due to the second predetermined voltage applied to the drain electrode;

momentarily increasing the gate bias applied to the gate electrode, and measuring the resulting current conducted by the drain electrode; and determining the resulting gain factor of the transistor based upon the change in gate bias and the resulting change in current conducted by the drain electrode due to the momentary increase in gate bias.

6. A method according to claim 1 wherein said step of adjusting the gate bias comprises the step of adjusting the gate bias by a voltage equal to the first change in threshold voltage between the nominal and first threshold voltages if the difference between the first and second changes in threshold voltage is greater than a predetermined amount.

7. A method according to claim 1 wherein said intermittent illuminating step comprises the step of filtering the light illuminating the partially transparent gate electrode such that the amount of light penetrating the semiconductor substrate is independent of the gate bias and the back gate bias.

8. An apparatus for compensating for variations in the electric field in an insulator layer of an insulated gate field effect transistor due to charge generation in the insulator layer, the transistor having drain, gate and source electrodes formed on drain, gate and source regions of the transistor, respectively, and a back gate electrode formed on a surface of the semiconductor substrate opposite the gate region, the gate electrode being at least partially transparent, the apparatus comprising:

nominal threshold voltage determining means for determining the nominal threshold voltage of the transistor for each of a plurality of predetermined back gate biases applied to the back gate electrode;

a first voltage source for applying a predetermined gate bias to the gate electrode, a predetermined back gate bias to the back gate electrode and a first predetermined voltage to the drain electrode;

first threshold voltage change determining means, responsive to said first voltage source, for determining a first threshold voltage of the transistor between the nominal threshold voltage and a first threshold voltage based upon the current conducted by the drain electrode and the gain factor of the transistor upon application of the first predetermined voltage to the drain electrode;

connecting means for electrically connecting the source and drain electrodes;

illuminating means for illuminating the at least partially transparent gate electrode;

current measuring means, responsive to said illuminating means, for measuring the current condusted by the gate electrode and the current conducted by the connected source and drain electrode while the partially transparent gate electrode is illuminated;

a second drain voltage source for applying the predetermined gate bias to the gate electrode, the predetermined back gate bias to the back gate electrode and a second predetermined voltage to the drain electrode after the drain and source electrodes have been disconnected;

second threshold voltage change determining means, responsive to said gate bias and second drain voltage sources, for determining change in a second threshold voltage of the transistor between the nominal threshold voltage and a second threshold voltage based upon the current conducted by the drain electrode and the gain factor of the transistor upon application of the second predetermined voltage to the drain electrode; and control means, responsive to said threshold voltage change determining means, for adjusting the gate bias applied by said gate bias source to the gate electrode to compensate for variations in the electric field of the insulator layer transistor based upon the difference between the first and second changes in threshold voltage.

9. An apparatus according to claim 8 wherein said first threshold voltage change determining means comprises:

first drain current measuring means, responsive to said gate bias and first drain voltage sources, for measuring the resulting current conducted by the drain electrode; and first gain factor measuring means, responsive to said gate bias and first drain voltage sources, for measuring the resulting gain factor of the transistor.

10. An apparatus according to claim 8 wherein said second threshold voltage change determining means comprises:

second drain current measuring means, responsive to said gate bias and second drain voltage sources, for measuring the resulting current conducted by the drain electrode; and second gain factor measuring means, responsive to said gate bias and second drain voltage sources, for measuring the gain factor of the transistor.

11. A barrier height distribution measuring apparatus according to claim 8 further comprising filter means for filtering the light supplied by said illuminating means such that the amount of light penetrating the semiconductor substrate is independent of the gate bias and the back gate bias.

* * * * *